(12) United States Patent
Rowell et al.

(10) Patent No.: US 7,228,105 B2
(45) Date of Patent: Jun. 5, 2007

(54) FIELD TEST CHAMBER ARRANGEMENT

(75) Inventors: Corbett Rowell, New York, NY (US); Anton Schmid, Akersberga (SE)

(73) Assignee: Integra Antennas Limited (CN)

( * ) Notice: Subject to any disclaimer, the term of this patent is extended or adjusted under 35 U.S.C. 154(b) by 341 days.

(21) Appl. No.: 10/133,660

(22) Filed: Apr. 29, 2002

(65) Prior Publication Data
US 2003/0008620 A1    Jan. 9, 2003

Related U.S. Application Data

(63) Continuation of application No. PCT/SE00/02128, filed on Oct. 30, 2000.

(30) Foreign Application Priority Data
Oct. 28, 1999  (SE) ..................... 9903925

(51) Int. Cl.
  *H04B 17/00* (2006.01)
(52) U.S. Cl. ............ 455/67.11; 455/423; 455/424; 455/67.14; 455/67.12; 318/16; 318/257; 318/280
(58) Field of Classification Search ............ 455/67.11, 455/67.12, 67.14, 423, 424
See application file for complete search history.

(56) References Cited

U.S. PATENT DOCUMENTS

| | | | | |
|---|---|---|---|---|
| 5,175,867 A | * | 12/1992 | Wejke et al. ............... | 455/439 |
| 5,521,904 A | * | 5/1996 | Eriksson et al. ............ | 370/249 |
| 5,530,412 A | | 6/1996 | Goldblum | |
| 6,222,503 B1 | * | 4/2001 | Gietema et al. ............ | 343/890 |
| 6,236,838 B1 | * | 5/2001 | Golemon et al. ......... | 455/67.11 |
| 6,321,068 B1 | * | 11/2001 | Zamat ......................... | 455/69 |
| 6,348,867 B1 | * | 2/2002 | Myllymaki ............... | 340/573.1 |
| 6,442,398 B1 | * | 8/2002 | Padovani et al. ........... | 455/522 |
| 6,542,754 B1 | * | 4/2003 | Sayers et al. ............... | 455/502 |
| 6,563,327 B1 | * | 5/2003 | Leferink ..................... | 324/637 |
| 6,690,662 B1 | * | 2/2004 | Komara et al. ............. | 370/342 |
| 6,760,582 B2 | * | 7/2004 | Gaal .......................... | 455/423 |

FOREIGN PATENT DOCUMENTS

| | | |
|---|---|---|
| DE | 19812923 | 9/1999 |
| JP | 10-26645 | 1/1998 |
| JP | 12-180489 | 6/2000 |
| WO | WO 9723069 | 6/1997 |

* cited by examiner

*Primary Examiner*—Marceau Milord
(74) *Attorney, Agent, or Firm*—Lerner, David, Littenberg, Krumholz & Mentlik, LLP

(57) ABSTRACT

A measurement arrangement for accurate and repeatable measurement of transmission and reception characteristics of a communication device. The arrangement comprises an at least partly conductive box forming a substantially enclosed cavity, and arranged in the box a reference antenna, at least one conducting mode mixer and/or at least one mode mixer with absorbing material.

13 Claims, 5 Drawing Sheets

FIELD TEST CHAMBER ARRANGEMENT

CROSS-REFERENCE TO RELATED APPLICATIONS

This application is a continuation application of International Application No. PCT/SE00/02128 with an international filing date of Oct. 30, 2000, and claims priority from Swedish Application No. 9903925-7, filed on Oct. 28, 1999.

TECHNICAL FIELD OF THE INVENTION

A measurement arrangement for accurate and repeatable measurement of transmission and reception characteristics of a communication device.

BACKGROUND OF THE INVENTION

Traditionally, antennas for mobile phones are either a helix or a whip or some combination thereof. These antennas were measured and compared to each other using gain tests from an anechoic chamber. A gain test in an anechoic chamber consists of measuring a single polarization (sometimes two—vertical and horizontal) with a directional antenna (reference antenna). The walls of the anechoic chamber are covered with an absorbing material to prevent reflections between the reference antenna and the mobile phone. These external antennas 100 (helix, whip, or combination) arranged on a mobile phone 110 tend to perform very well inside the anechoic chamber as they receive one of the polarizations 120 very well, as shown in FIG. 1.

In FIG. 2 an internal antenna 200 is illustrated, which usually is mounted above a ground plane, i.e. the PCB 230 of mobile phone 210, and is able to receive several polarizations 220 of an incoming wave. This is due to the electric and magnetic field distributions across the top of the antenna. In limited (only two to three planes measured) anechoic chamber measurement tests, the internal antennas demonstrate low performance. A complete anechoic chamber test, where ten or more planes are measured, the internal antennas have similar performance to the external antennas.

The typical environment where the mobile phone is used is very different from the anechoic chamber. In an urban environments schematically shown in FIG. 3, the field from the base station 350 (reference antenna) gets scattered through buildings 360, vehicles, people, etc. This scattered field that arrives at the mobile phone is comprised of several polarizations and magnitudes (changing in a random fashion). The phase of the incoming signals changes, sometimes adding to give a strong field, sometimes cancelling out completely. In addition, the phones are next to a user's head with their hand in the near vicinity. The head and the hand disturb the near fields of the mobile phone, changing the input impedance, and the far fields by absorbing some of the radiation emitted from the mobile phone.

Since the anechoic chamber does not provide sufficient information about the phone's performance in the actual environment, mobile phone manufacturers measure their phones in the field (called a field test). This involves programming the phone to send received power levels (or other performance measurements such as BER to a computer. The phone is then tested in several areas and several thousand samples are taken. This measurement typically takes several hours. Furthermore, it is not repeatable at a later time since some of the scattering objects are moving (i.e. Vehicles and people).

Several measurement systems on the market are intended for measurement of EMC and are not suitable for mobile phone measurements. These EMC scattered field boxes have no absorbing or lossy material within the chamber. If a mobile phone was placed inside this EMC chamber, the high densities of electrical field strength would disturb the near-fields of the mobile phone, changing the input impedance. Other scattered field systems have been proposed, but they rely on a single fan (or pendulum or other method of "stirring the modes") with low losses (ie. highly conductive-like metal).

SUMMARY OF THE INVENTION

The main object of the present invention to present a new measurement system for accurate and repeatable measurement of mobile phones.

For this reason the initially mentioned arrangement comprises an at least partly conductive box, forming a substantially enclosed cavity, and arranged in said box a reference antenna, a phantom unit, at least one conducting mode mixer and at least one mode mixer with absorbing material.

Moreover, said box includes a phantom unit, which is arranged for simulating a part of a human body. The box may comprise at least six conducting sides and the side may be arranged as substantially rough walls. Moreover, the box can be arranged with conducting sides and absorbing sides as to vary the scattering of the field.

Preferably, one conducting mode mixer is defined as an object with periodic oscillations-fan. Moreover, the absorbing material is dielectric or ferrite.

The arrangement in one embodiment may also comprise additional mode mixer, either conducting or absorbing.

For simulation reasons different conducting/absorbing objects can be placed inside the box to simulate different scattered fields.

The invention also refers to a method in a new measurement system for accurate and repeatable measurement of characteristics of a communication device. The method comprises the step of creating a scattered field, which is substantially similar to a network for said communication device in an urban setting, within a controlled environment. Said controlled environment comprises a partly conductive box, forming a substantially enclosed cavity, and arranged in said box a reference antenna, at least one conducting mode mixer and at least one mode mixer with absorbing material. For testing the efficiency of the communication device, it is arranged to rotate or oscillate. It is also possible to arrange a head or body phantom and said communication device are arranged to rotate or oscillate relative each other

BRIEF DESCRIPTION OF THE DRAWINGS

In the following, the invention will be further described in a non-limiting way under reference to the accompanying drawings in which.

DETAILED DESCRIPTION OF THE PREFERRED EMBODIMENTS

Figure 1:
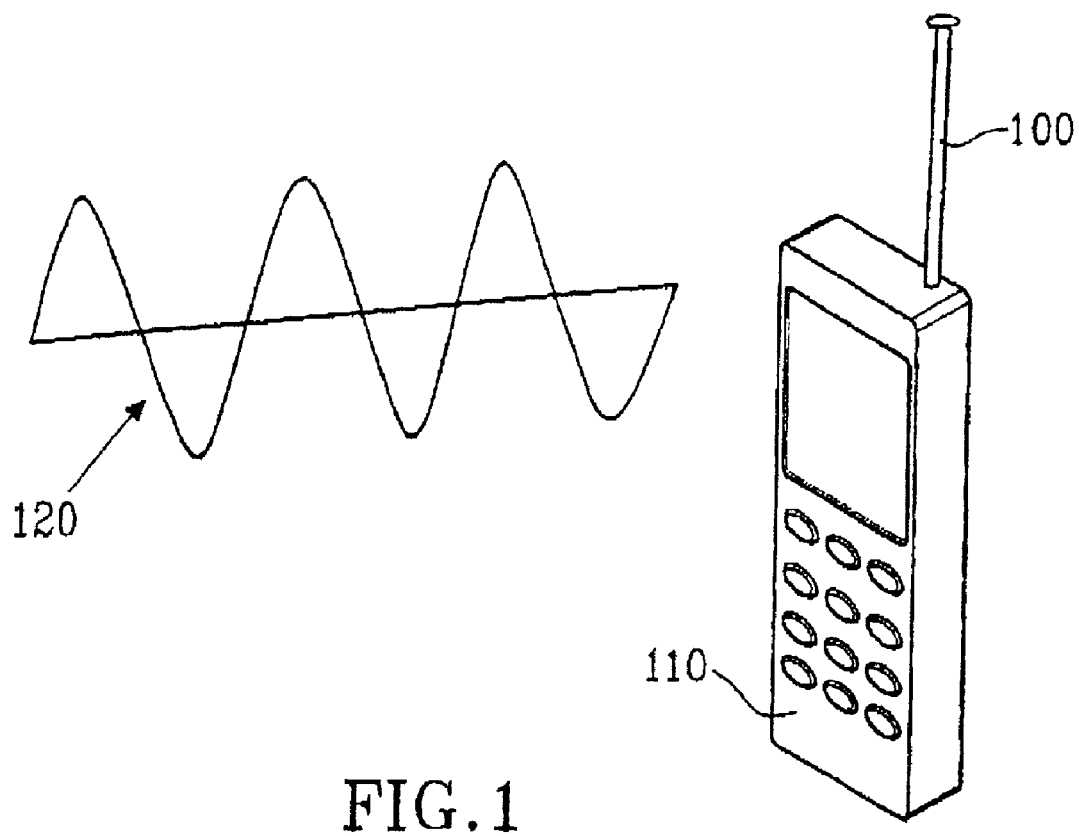
FIG. 1 shows a mobile phone with helix/whip antenna receiving single polarized field.
Figure 2:
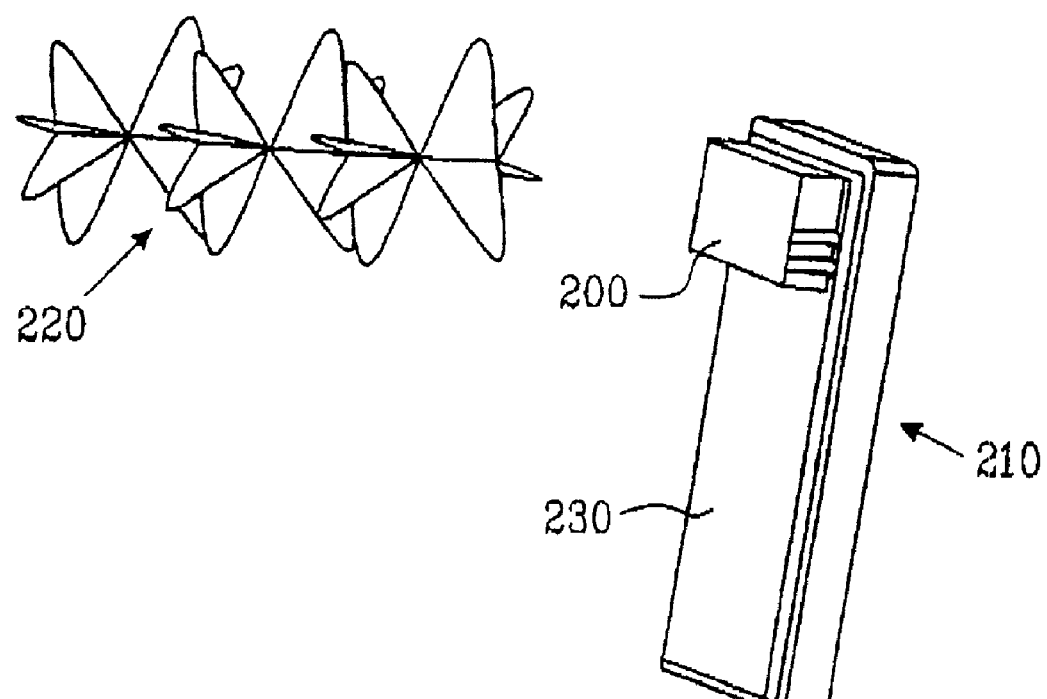
FIG. 2 shows a mobile phone internal antenna receiving multiple polarized field.
Figure 3:
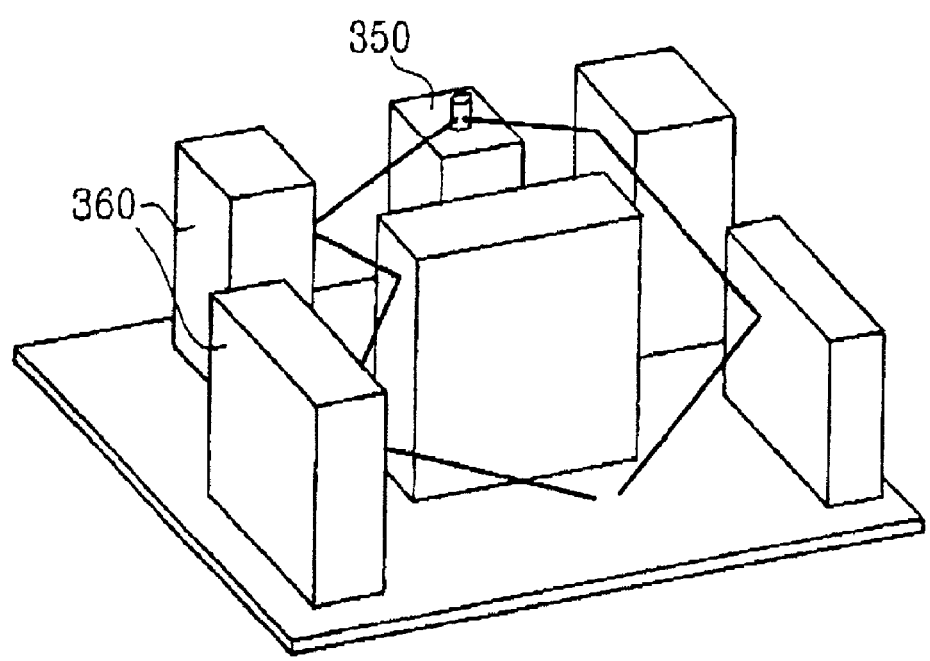
FIG. 3 shows a multipath field in an urban environment.
Figure 4:
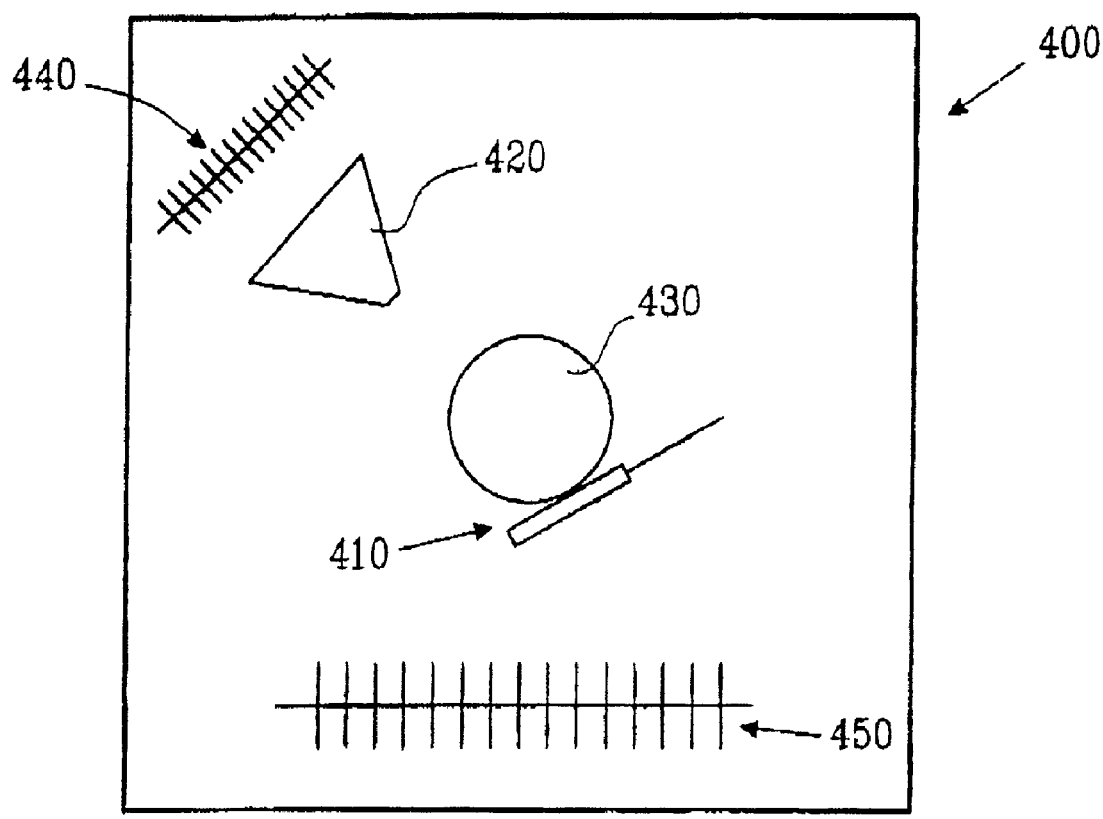
FIG. 4 is a schematic embodiment of a field test chamber according to the invention.

This invention proposes a new measurement system for accurate and repeatable measurement of mobile phones. According to the invention a scattered field is created, which is similar to the mobile phone network in an urban setting, within a controlled environment. This invention as schematically illustrated in FIG. 4 consists of a shielded metal box 400, a (transmitting) reference antenna 420, a phantom unit 430 with mount for the communications device 410, at least two mode-stirrers (mixers) 440 and 450, where at least one of the mixers, e.g. mixer 450 comprises of absorbing material or a dielectric. The mode-stirrer is designed to mix the polarizations of an incoming field-it can take the form of a fan, a pendulum, etc.

The phantom is arranged to simulate a part of human body, such as head and/or hand, etc.

It is also possible to provide the shielding box 400 with optional inserts (not shown) to change the scattered environment. The head unit may be provided with an optional hand unit (not shown).

At least two mixers of different oscillation frequencies are required to increase the number of samples measured in the chamber. To create a field with sharp decreases in the field strength (to correspond to an urban mobile network), one of the mixers needs to contain an absorbing material or dielectric to absorb the field near the communication device provided with an antenna, such as a mobile phone.

Figure 5:
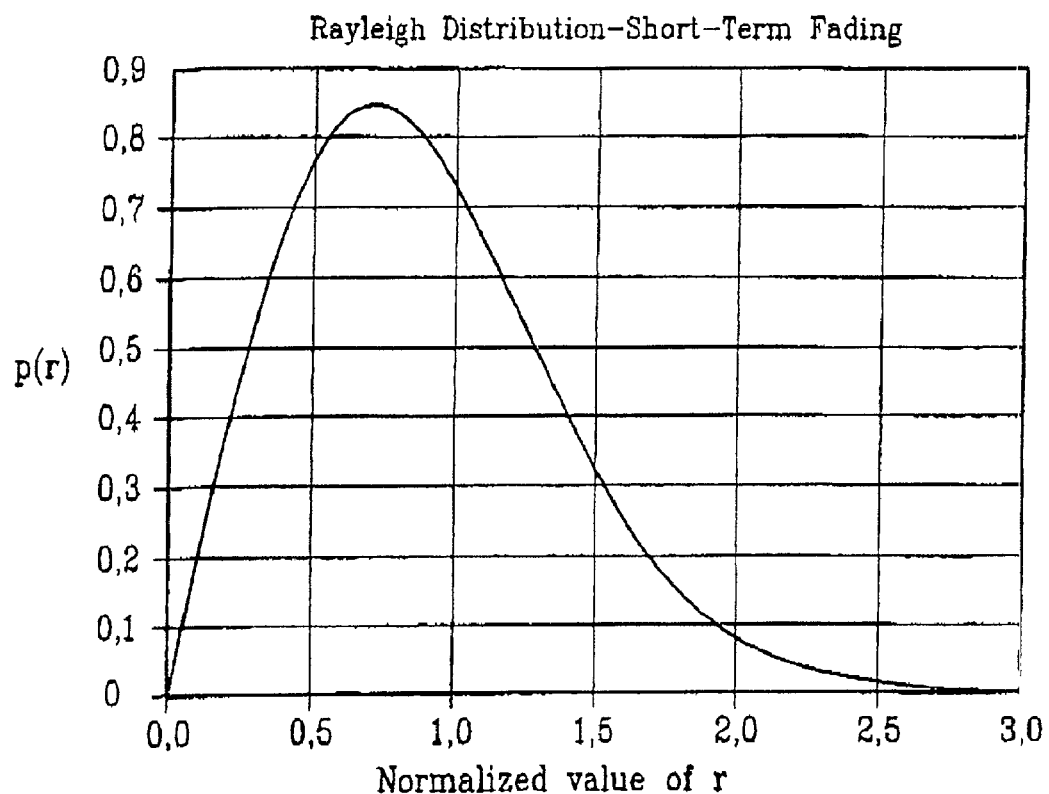
FIG. 5 is a graph illustrating the Rayleigh Distribution according to the invention.

The results measured according to the invention are compared with the actual mobile phone environment using mathematical formulas and statistical distributions. Several journal papers have shown that the scattered field received at the mobile phone in an urban environment can be modelled with the Rayleigh distribution as seen in FIG. 5.

Figure 6:
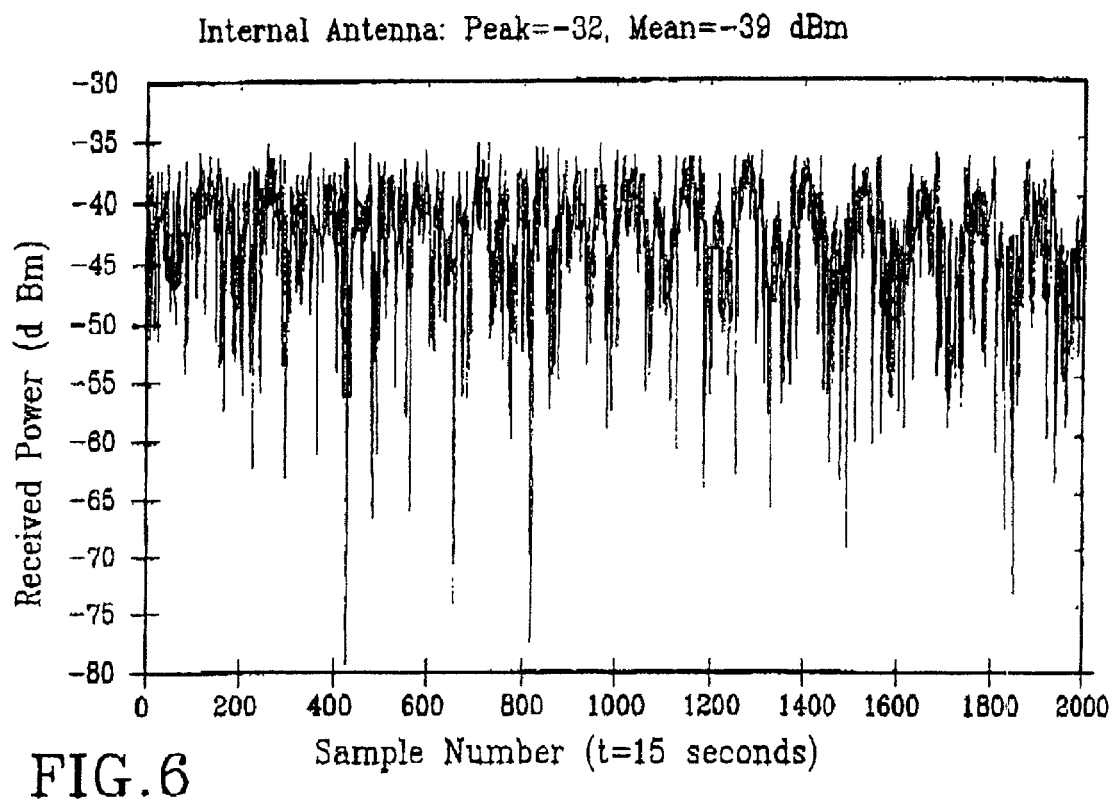
FIGS. 6 and 7 show results of a Field Test Chamber according to the invention.
Figure 7:
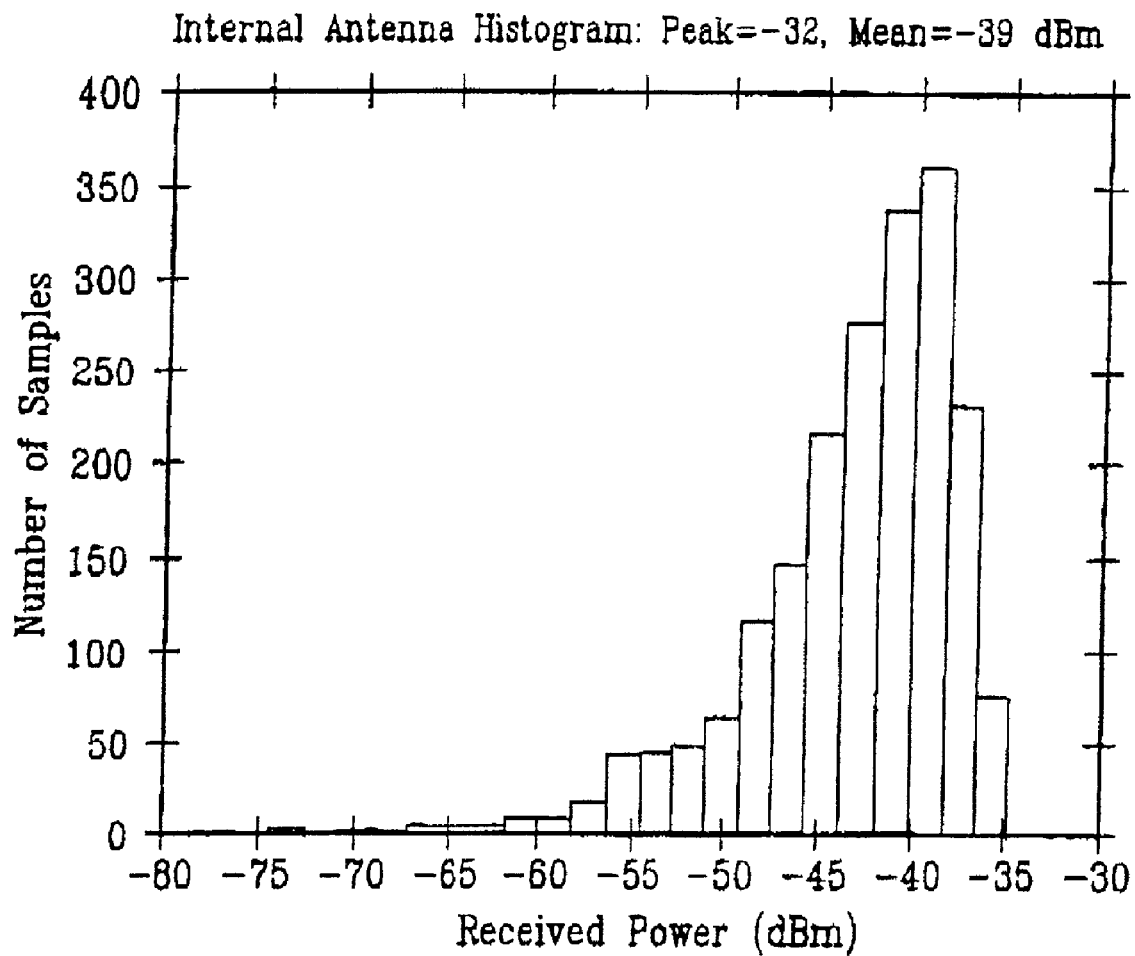

Results from this invention have been compared to the Rayleigh distribution and matched as shown in FIGS. 6 and 7. FIG. 6 is data from the measurement of a mobile phone with an internal antenna. The data is the received power at the antenna. There is a mean received power with sudden drops of 30 to 50 d—this matches data taken in actual field test measurements (see Microwave Mobile Communications by William C. Jakes, p. 13–19). The second figure is further confirmation of the validity of these tests—the probability distribution function of the data illustrated in FIG. 6. Comparing this data to FIG. 5 (and performing a mirror translation), it can be seen that the measured data matches the theoretical model.

Figure 8:
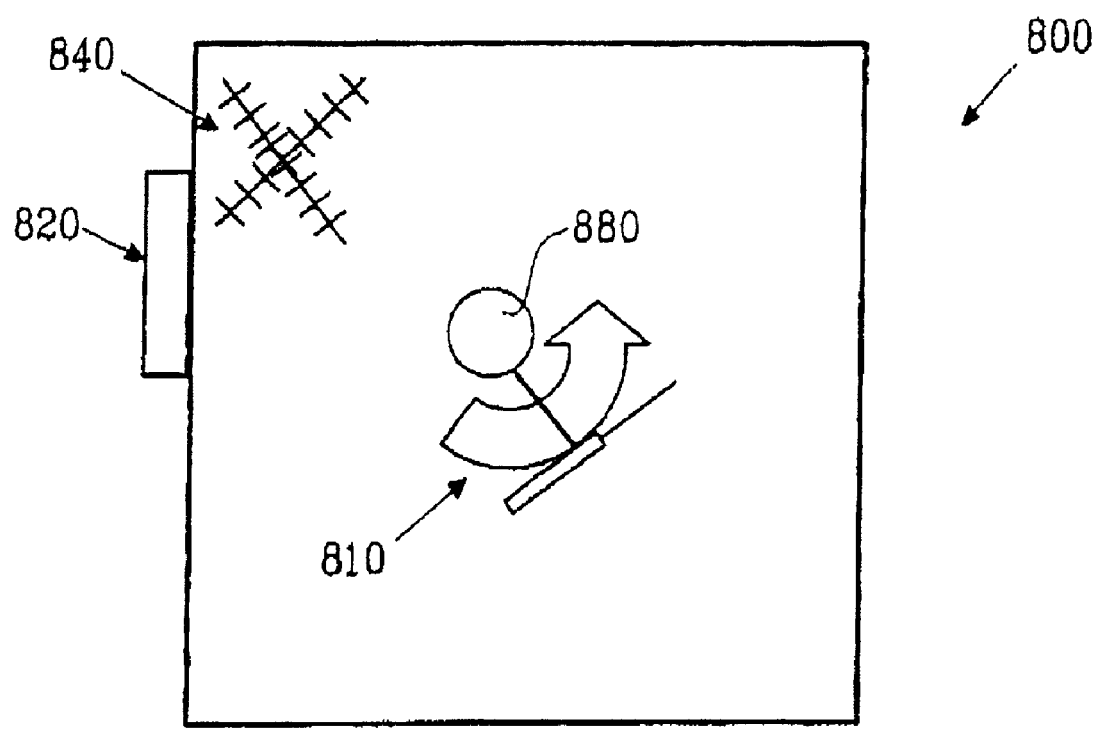
FIGS. 8 and 9 are schematic views of alternative embodiments of field test chambers, according to the invention.

In one embodiment, as illustrated in FIG. 8, the chamber 800 can function as mode-stirring chamber, defined as a shield metall box with oscillating fans or motors, with some lossy material contained inside, which for example can be an absorber hanging from the ceiling, a phantom head or blocks of dielectric necessary to prevent high strength. The chamber 800, consisting of a shield metall box, comprises a reference antenna 820, a conducting mode stirring device 840 and an arrangement 880 for rotating or oscillating the communication device 810 under test. This arrangement can be used for creating scattered field with field strength from substantially all directions. Thus, the arrangement can be used for antenna or communication device efficiency tests.

Figure 9:
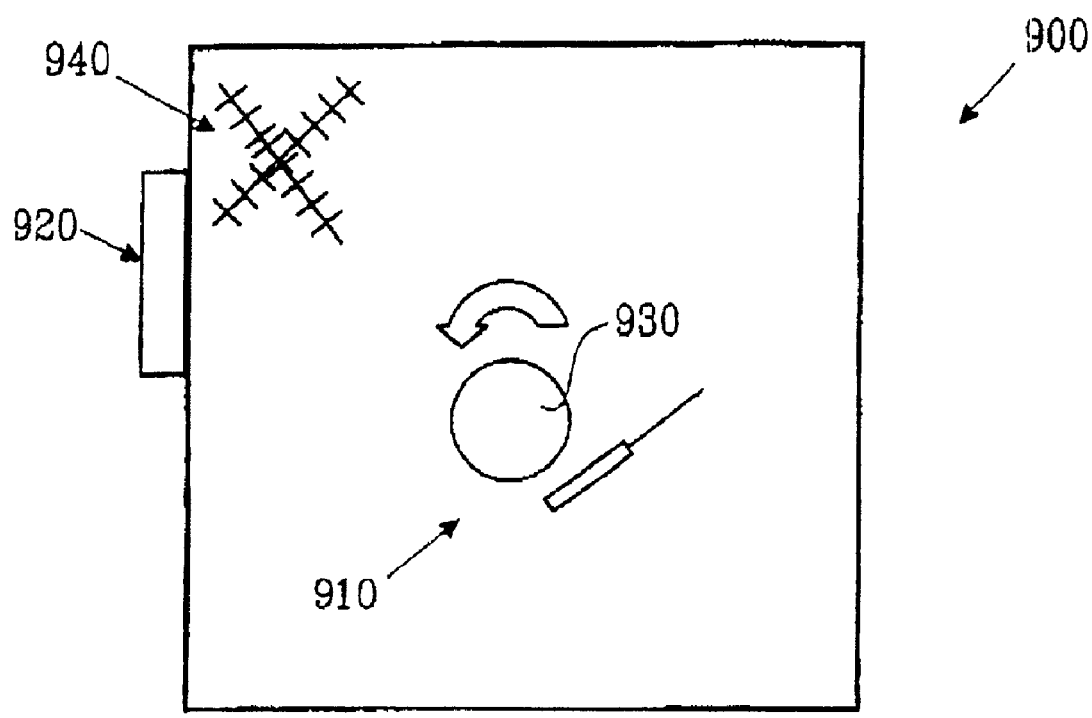

FIG. 9 is another embodiment of the chamber according to FIG. 8. The chamber 900, consisting of a shield metall box, comprises a reference antenna 920, a mode stirring device 940 and a head or body phantom 930, which is arranged rotatable or oscillating with respect to the communication device 910 under test. The communication device and the phantom can of course be arranged rotatable relative each other.

The invention is not limited the shown embodiments but can be varied in a number of ways without departing from the scope of the appended claims and the arrangement and the method can be implemented in various ways depending on application, functional units, needs and requirements etc.

The invention claimed is:

1. A measurement arrangement for accurate and repeatable measurement of transmission and reception characteristics of a communication device, comprising:
   a box being at least partly conductive and forming a substantially enclosed cavity;
   a reference antenna arranged in said box communicating with interior of the box;
   at least one conducting mode mixer;
   at least one mode mixer with absorbing material; and
   a phantom unit for simulating a human body part.

2. The arrangement according to claim 1, wherein said box comprises at least six conducting sides.

3. The arrangement according to claim 1, wherein said box comprises substantially rough walls.

4. The arrangement according to claim 1, wherein said conducting mode mixer is provided as a periodically oscillating fan.

5. The arrangement according to claim 1, wherein said absorbing material is one of dielectric or ferrite.

6. The arrangement according to claim 1, further comprising a second mode mixer.

7. The arrangement according to claim 1, wherein said communication device is arranged rotating or oscillating in said box.

8. The arrangement according to claim 1, wherein said phantom is arranged rotating or oscillating in said box.

9. The arrangement according to claim 1, wherein said box is arranged with conducting sides and absorbing sides for varying scattering of a field.

10. The arrangement according to claim 1, wherein different objects having conducting or absorbing features are placed inside the box to stimulate different scattered fields.

11. A method in a measurement system for accurate and repeatable measurement of characteristics of a communication device, comprising the steps of:
    creating a scattered field within a controlled environment, said controlled environment comprising a partly conductive box, forming a substantially enclosed cavity, and arranged in said box a reference antenna communicating with interior of the box, at least one conducting mode mixer, at least one mode mixer with absorbing material and a phantom unit for simulating a human body part, and measuring said field.

12. The method according to claim 11, wherein said communication device is rotated or oscillated.

13. The method according to claim 11, wherein said communication devices are arranged to rotate or oscillate relative to each other.

\* \* \* \* \*